_(12)_ United States Patent
Kim et al.

(10) Patent No.: US 12,147,746 B1
(45) Date of Patent: Nov. 19, 2024

(54) METHOD AND SYSTEM FOR VERIFYING OPERATION AND DATA PRECISION OF HARDWARE FOR ARTIFICIAL INTELLIGENCE

(71) Applicant: HyperAccel Co., Ltd., Hwaseong-si (KR)

(72) Inventors: Junsoo Kim, Hwaseong-si (KR); Seongmin Hong, Hwaseong-si (KR)

(73) Assignee: HyperAccel Co., Ltd., Hwaseong-si (KR)

( * ) Notice: Subject to any disclaimer, the term of this patent is extended or adjusted under 35 U.S.C. 154(b) by 0 days.

(21) Appl. No.: 18/744,347

(22) Filed: Jun. 14, 2024

(30) Foreign Application Priority Data

Jun. 16, 2023 (KR) .......................... 10-2023-0077571

(51) Int. Cl.
*G06F 30/27* (2020.01)
(52) U.S. Cl.
CPC .................................... *G06F 30/27* (2020.01)
(58) Field of Classification Search
CPC ...... G06F 30/27; G06F 30/33; G06F 30/3308; G06F 30/331; G06F 30/3323; G06F 30/367; G06N 30/08
USPC .......................................................... 703/21
See application file for complete search history.

(56) References Cited

U.S. PATENT DOCUMENTS

2024/0020536 A1\* 1/2024 Ling ........................ G06F 30/27

FOREIGN PATENT DOCUMENTS

| KR | 10-2021-0057431 | 5/2021 |
|---|---|---|
| KR | 10-2022-0041224 | 3/2022 |

OTHER PUBLICATIONS

Decision to Grant a Patent mailed Mar. 7, 2024, issued in corresponding Korean Application No. 10-2023-0077571, filed Jun. 16, 2023, 6 pages.
Sung, M., et al. "Hardware Resource Aware Deep-learning Simulator Implementation," www.dbpia.co.kr, 2 pages.
Munoz-Martinez, F., et al. "STONNE: Enabling Cycle-Level Microarchitectural Simulation for DNN Inference Accelerators," 2021 IEEE International Symposium on Workload Characterization (IISWC), 13 pages.

(Continued)

*Primary Examiner* — Paul Dinh
(74) *Attorney, Agent, or Firm* — Christensen O'Connor Johnson Kindness PLLC

(57) ABSTRACT

Provided is a method and system for verifying an operation and data precision of generative giant artificial intelligence hardware. A verification method may include receiving target device information, a model instruction, and a model parameter related to an artificial intelligence (AI) model; constructing a simulator corresponding to real hardware based on the target device information; processing an operation between the model instruction and the model parameter through the constructed simulator; and storing a processing result of the operation in a memory module included in the simulator. Here, the at least one processor may include a CPU and a GPU and the constructing of the simulator may include constructing a first simulator that uses the CPU in response to a high-precision mode being selected and constructing a second simulator that uses both the CPU and the GPU in response to a low-latency mode being selected.

10 Claims, 14 Drawing Sheets

(56) References Cited

OTHER PUBLICATIONS

Request for the Submission of an Opinion mailed Sep. 8, 2023, issued in corresponding Korean Application No. 10-2023-0077571, filed Jun. 16, 2023, 12 pages.
Notice of Final Rejection mailed Dec. 15, 2023, issued in corresponding Korean Application No. 10-2023-0077571, filed Jun. 16, 2023, 3 pages.
Request for the Submission of an Opinion mailed Jan. 16, 2024, issued in corresponding Korean Application No. 10-2023-0077571, filed Jun. 16, 2023, 12 pages.

\* cited by examiner

METHOD AND SYSTEM FOR VERIFYING OPERATION AND DATA PRECISION OF HARDWARE FOR ARTIFICIAL INTELLIGENCE

CROSS-REFERENCE TO RELATED APPLICATION(S)

This application claims the priority benefit of Korean Patent Application No. 10-2023-0077571, filed on Jun. 16, 2023, in the Korean Intellectual Property Office, the disclosure of which is incorporated herein by reference.

BACKGROUND

1. Field of the Invention

Example embodiments relate to a method and system for verifying an operation and data density of generative giant artificial intelligence (AI) hardware and more particularly, to a hardware simulator framework optimized for a giant AI model.

2. Description of the Related Art

A giant artificial intelligence (AI) model currently deployed has a data amount with a different size from that of the existing convolutional neural network (CNN). For example, in response to release of the giant AI model with the size of tens of gigabytes (GB), hardware acceleration is also required. However, to quickly develop hardware for this giant AI model, a simulator that mimics hardware is required.

Also, due to a data amount of the giant AI model, a hardware simulator also has a burden in loading the model. Therefore, to perform a comparison in the large range as needed, the hardware simulator also needs acceleration.

In addition, in an AI model, data types are often reduced to reduce a size of an operator. However, since this affects the model accuracy, it is important to verify a possible reduction in the size of the operator. However, ultimately, an operator of a central processing unit (CPU) is used. Therefore, unless the operator itself is implemented in software, it is not easy to determine the possible reduction in the size of the operator. Also, it becomes more issue since a computational amount in the giant AI model is much larger.

Reference material includes Korean Patent Laid-Open Publication No. 10-2022-0041224.

SUMMARY

Example embodiments may provide a method and system for an operation and data precision of generative giant artificial intelligence hardware.

Technical subjects of the present invention are not limited to the aforementioned technical subjects and still other technical subjects not described herein will be clearly understood by one of ordinary skill in the art from the following description.

According to an example embodiment, there is provided a verification method of a computer device including at least one processor, the verification method including receiving, by the at least one processor, target device information, a model instruction, and a model parameter related to an artificial intelligence (AI) model; constructing, by the at least one processor, a simulator corresponding to real hardware based on the target device information; processing, by the at least one processor, an operation between the model instruction and the model parameter through the constructed simulator; and storing, by the at least one processor, a processing result of the operation in a memory module included in the simulator, wherein the at least one processor includes a central processing unit (CPU) and a graphics processing unit (GPU), and the constructing of the simulator may include constructing a first simulator that uses the CPU in response to a high-precision mode being selected and constructing a second simulator that uses both the CPU and the GPU in response to a low-latency mode being selected.

According to an aspect, the constructing of the simulator may include determining a mode of the simulator as one of the high-precision mode and the low-latency mode; in response to the mode of the simulator being determined as the high-precision mode, constructing a first simulator that implements at least one module processing the operation in the simulator and the memory module using the CPU; and in response to the mode of the simulator being determined as the low-latency mode, constructing a second simulator that implements at least one module processing the operation using the GPU and implements the memory module using the CPU.

According to another aspect, the constructing of the first simulator may include assigning the module processing the operation and the memory module to the CPU.

According to still another aspect, the constructing of the second simulator may include assigning the module processing the operation to the GPU and assigning the memory module to the CPU.

According to still another aspect, the determining may include determining the mode of the simulator as one of the high-precision mode and the low-latency mode based on at least one of a layer length included in the AI model, the number of layers, a token length for the AI model, and the number of tokens.

According to still another aspect, in the high-precision mode, a median value of the operation may be verifiable in each module of the first simulator, and in the low-latency mode, a final value of the operation may be verifiable in the memory module of the second simulator.

According to still another aspect, the second simulator may be configured to inversely compute the weight matrix with the adjusted position of the value using a linear library function based on the GPU and to return the same to an original weight matrix.

According to still another aspect, the second simulator may be configured to process the operation through a compute unified device architecture (CUDA) kernel of the GPU.

According to an example embodiment, there is provided a computer program stored in a computer-readable recording medium to execute the method on the computer device in conjunction with the computer device.

According to an example embodiment, there is provided a non-transitory computer-readable recording medium storing a program to execute the method on the computer device.

According to an example embodiment, there is provided a computer device including at least one processor configured to execute computer-readable instructions, wherein the at least one processor is configured to receive target device information, a model instruction, and a model parameter related to an AI model, to construct a simulator corresponding to real hardware based on the target device information, to process an operation between the model instruction and the model parameter through the constructed simulator, and to store a processing result of the operation in a memory module included in the simulator.

Specific details of other example embodiments are included in the detailed description and drawings.

According to some example embodiments, it is possible to provide a method and system for verifying an operation and data precision of generative giant artificial intelligence hardware.

Effects of the present invention are not limited to the aforementioned effects and still other effects not described herein will be clearly understood by one of ordinary skill in the art from the following description.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
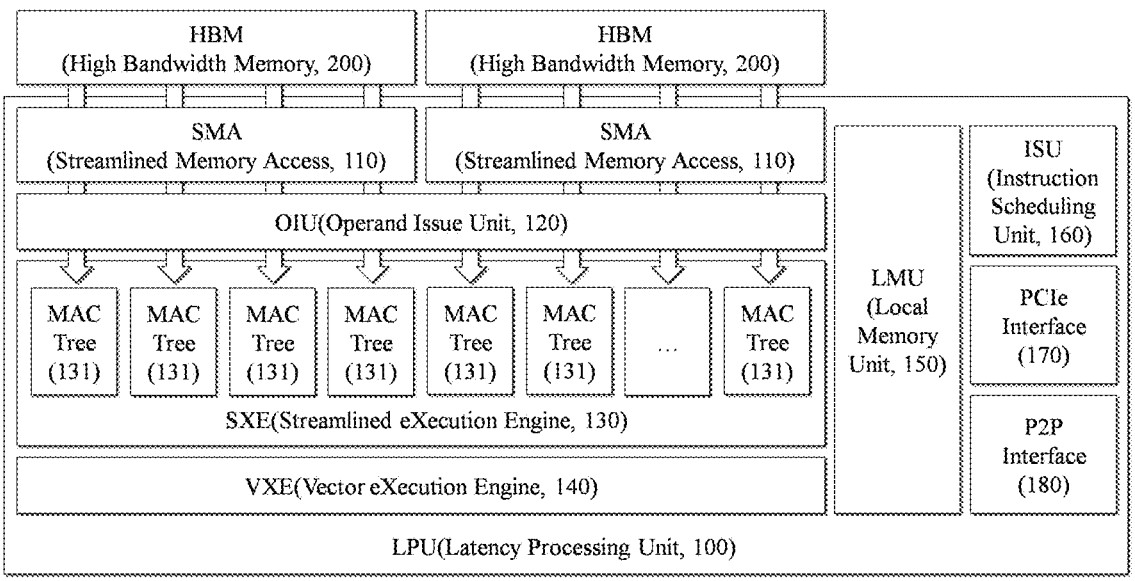
FIG. 1 illustrates an example of a structure of a latency processing unit according to an example embodiment.

Advantages and features of the present invention and methods to achieve the same will become clear with reference to example embodiments described in detail along with the accompanying drawings. However, the present invention is not limited to example embodiments disclosed blow and may be implemented in various forms. Here, the example embodiments are provided to make the disclosure of the present invention complete and to fully inform one of ordinary skill in the art to which the present invention pertains of the scope of the present invention and the present invention is defined by the scope of the claims. Like reference numerals used herein refer to like elements throughout.

When it is described that one component is "connected to" or "coupled to" another component, it may be understood that the one component is directly connected to or coupled to the other component or that still other component is interposed between the two components. In contrast, it should be noted that when it is described that one component is "directly connected to" or "directly coupled to" to another component, still other component may not be present therebetween. As used herein, the expression "and/or" includes any one and any combination of the associated listed items.

The terms used herein are to explain the example embodiments and not to be limiting of the present invention. Herein, the singular forms "a," "an," and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

Although terms of "first," "second," and the like are used to explain various components, the components are not limited to such terms. These terms are used only to distinguish one component from another component. For example, a first component may be referred to as a second component, or similarly, the second component may be referred to as the first component within the scope of the present invention.

Unless otherwise defined herein, all terms used herein (including technical or scientific terms) have the same meanings as those generally understood by one of ordinary skill in the art. Also, terms defined in dictionaries generally used should be construed to have meanings matching contextual meanings in the related art and are not to be construed as an ideal or excessively formal meaning unless otherwise defined herein.

An example of a hardware structure is described with reference to FIGS. 1 to 9.

FIG. 1 illustrates an example of a structure of a latency processing unit according to an example embodiment.

Referring to FIG. 1, a latency processing unit (LPU) 100 according to an example embodiment may include a streamlined memory access (SMA) 110, an operand issue unit (OIU) 120, a streamlined execution engine (SXE) 130, a vector execution engine (VXE) 140, a local memory unit (LMU) 150, an instruction scheduling unit (ISU) 160, a peripheral component interconnect express (PCIe) interface170, and a peer-to-peer (P2P) interface 180.

The SMA 110 may be a special direct memory access (DMA). For example, the SMA 110 may connect all channels (e.g., 32 channels) of high bandwidth memory (HBM) 200 to an execution engine (e.g., SXE 130) and may transmit FP16 (half precision floating point) data at a maximum bandwidth. The SMA 110 may be designed as deep first in first out (FIFO) to transmit consecutive memory requests based on a pre-loaded memory (MEM) instruction. Memory mapping considering hardware may reduce a latency by eliminating matrix change or transposition task. Therefore, the SMA 110 may stream data received with a maximum burst size to an execution engine with a minimum latency. The SMA 110 may efficiently execute transpose of a matrix using a strobe signal. Streaming data may include a parameter for vector matrix execution (e.g., weight, bias) and other vector-related execution (e.g., gamma/beta, embedding).

The OIU 120 may adjust data streamed from the SMA 110 (e.g., first operand) and input from an on-chip memory (e.g., second operand) before issuance to the execution engine.

Based on an execute (EXE) instruction, the OIU 120 may generate a microcode that configures the execution engine and determines a target engine of operand. Also, the OIU 120 may include a reuse buffer to eliminate a read idle time of static operand (e.g., input vector) and an asymmetric buffer to maintain vectorized data used as a scalar (e.g., bias). Therefore, an appropriate operand is almost always prefetched and ready to be issued immediately to the execution engine.

The SXE 130 refers to main computing hardware of the LPU 100 and may be designed to make the full use of an incoming bandwidth to execute vector-matrix multiplication (V·M), such as attention, 1D convolution, and feedforward network. The SXE 130 may include the number of multiply-and-accumulation (MAC) trees 131 capable of matching a reception bandwidth and an operation bandwidth of the HBM 200. For example, when 1024 elements are received every cycle from the HBM 200, the reception bandwidth and the operation bandwidth may be matched through 16 MAC trees 131 each having 64 input vectors. The MAC trees 131 each having 64 input vectors may include 64 multipliers and 63 adders.

The plurality of MAC trees 131 may perform a matrix multiplication operation, and may be connected for each channel through the HBM 200 and the SMA 110. In detail, one of the plurality of MAC trees 131 may be connected to the HBM 200 through a single channel and may maximize a transmission bandwidth between the LPU 100 and the HBM 200 and may perform a matrix multiplication operation required for a very large artificial intelligence model without bottlenecking. Therefore, the number of the plurality of MAC trees 131 and the number of memory channels of the HBM 200 may be configured to be the same.

A matrix multiplication operation result of the plurality of MAC trees 131 may be provided to the VXE 140. The VXE 140 may be implemented using a custom low-latency arithmetic logic unit (ALU) and may execute a vector operation, such as token embedding, softmax, normalization, and residual operation. Since this vector operation relatively infrequently occurs, the OIU 120 may adjust fan-in to this path to reduce hardware resources with negligible performance. The VXE 140 may be provided with an operation result of the plurality of MAC trees 131 and may perform a subsequent operation by receiving an activation value from the LMU 150. The VXE 140 may be configured to include various operator combinations by including a plurality of multi-function operation interfaces.

The LMU 150 may deliver the activation value to the plurality of MAC trees 131 and the VXE 140. Here, the LMU 150 may copy and transmit the activation value to deliver the same activation value to the plurality of MAC trees 131. Also, the LMU 150 may store result values operated by the plurality of MAC trees 131 and the VXE 140. That is, the LMU 150 may function within the LPU 100 as an internal buffer corresponding to the HBM 200. Here, in a matrix multiplication operation, the LPU 100 may store an activation value with a high reuse rate or a parameter of a model in the LMU 150 and may store a weight with a low reuse rate in the HBM 200. The LMU 150 may be implemented as a 4 MB multi-bank register file with scalar vector separation for fast, high-bandwidth access of input, output, and intermediate data. Also, the LMU 150 may be a multi-port that simultaneously supports read and write in a write-store stage of the execution engine and the OIU 120.

The ISU 160 may control the overall execution flow of the LPU 100. The ISU 160 may employ a parallel instruction chaining (PIC) method and may consecutively execute dependent instructions using instruction chaining. Since PIC classifies instructions that require independent hardware into a group of dependent instructions (e.g., memory (MEM) instruction, execution (EXE) instruction, network (NET) instruction), all instructions may be executed in parallel with an instruction chain of each group, which may lead to achieving low control overhead and latency saving. Also, the ISU 160 may update a control register (e.g., token and layer number) for engine execution. An internal scheduler may support out-of-order execution of the SXE 130 and the VXE 140 to maximize hardware utilization and a powerful scoreboard may be designed to handle data risk. For example, the ISU 160 may perform scheduling such that the plurality of MAC trees 131 and the VXE 140 may simultaneously perform an operation. Also, by pre-executing an instruction without dependency to maximize a parallel operation, the ISU 160 may minimize an idle time of each operating device and a memory access device and may improve computational throughput and latency accordingly.

The LPU 100 may be connected to a host computer through the PCIe interface 170, may perform an operation by receiving an instruction required for operating the LPU 100, an input value of a very large artificial intelligence model, and a weight from the host computer and then may deliver the result thereof to the host computer.

The LPU 100 may be scaled out to a cluster of the plurality of LPUs connected through the P2P interface 180. The scaled-out cluster structure may further improve acceleration of an operation of the very large artificial intelligence model.

FIGS. 2 to 5 illustrate examples of implementation models of latency processing units (LPUs) according to example embodiments. The foregoing example embodiment of FIG. 1 describes an example of an implementation model using an external memory of the HBM 200. Instead of the HBM 200, a double data rate (DDR) may be used as the external memory. Here, a large model may not be stored in a single device and so, may be separated into a plurality of partitions, and may be stored in external memories for a plurality of devices (plurality of LPUs) by partition. In this case, synchronization between the plurality of devices may be required for inference of the large model.

Figure 2:
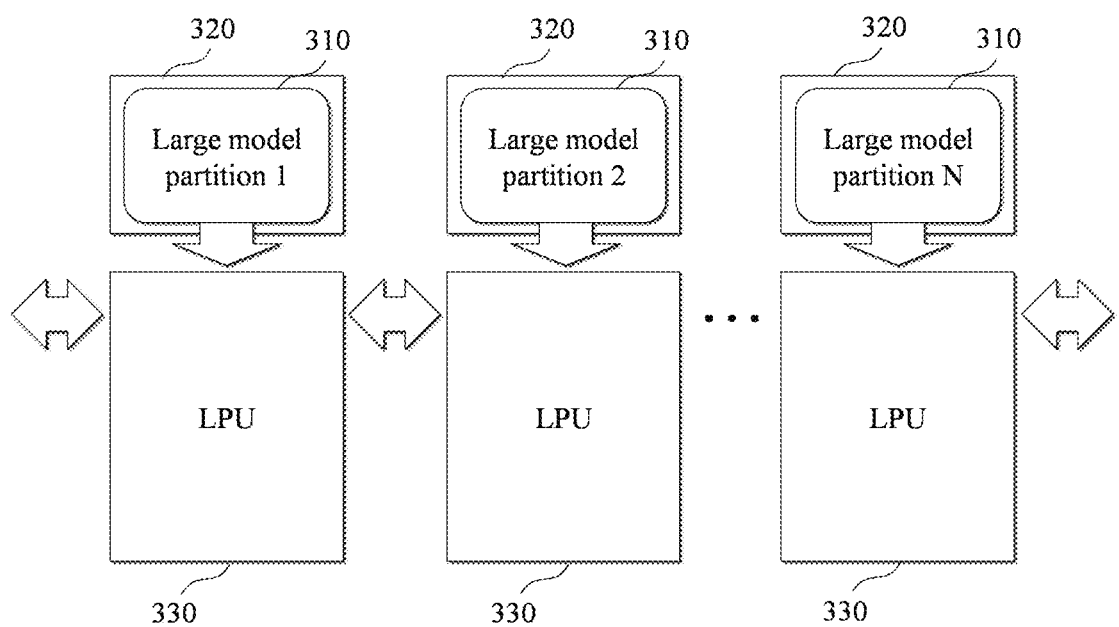
FIGS. 2 to 5 illustrate examples of implementation models of latency processing units (LPUs) according to example embodiments.

Similar to the example embodiment of FIG. 1, the example embodiment of FIG. 2 illustrates a plurality of external memories 320 configured to store a plurality of partitions 310 of a large model and a plurality of LPUs 330 connected in parallel to the plurality of external memories 320. A single LPU may be implemented in a single field programmable gate array (FPGA) and a single partition may be connected in parallel to a single FPGA. A transformer structure includes multi-head attention, layer normalization, feed forward, etc., in a decoder layer and may model-parallelize multi-head attention and feed forward. In this case, when multi-head attention is terminated, a single embedding vector may be output as a result. Since a single device has only a embedding vector portion, a plurality of devices needs to share each embedding vector to move on to a next operation and synchronization may be required accordingly. Here, considering scalability, a single LPU may be implemented with a plurality of external memories (e.g., two or four). For example, the example embodiment of FIG. 1 shows an example of using two HBMs 200 each in which a single partition is stored.

Figure 3:
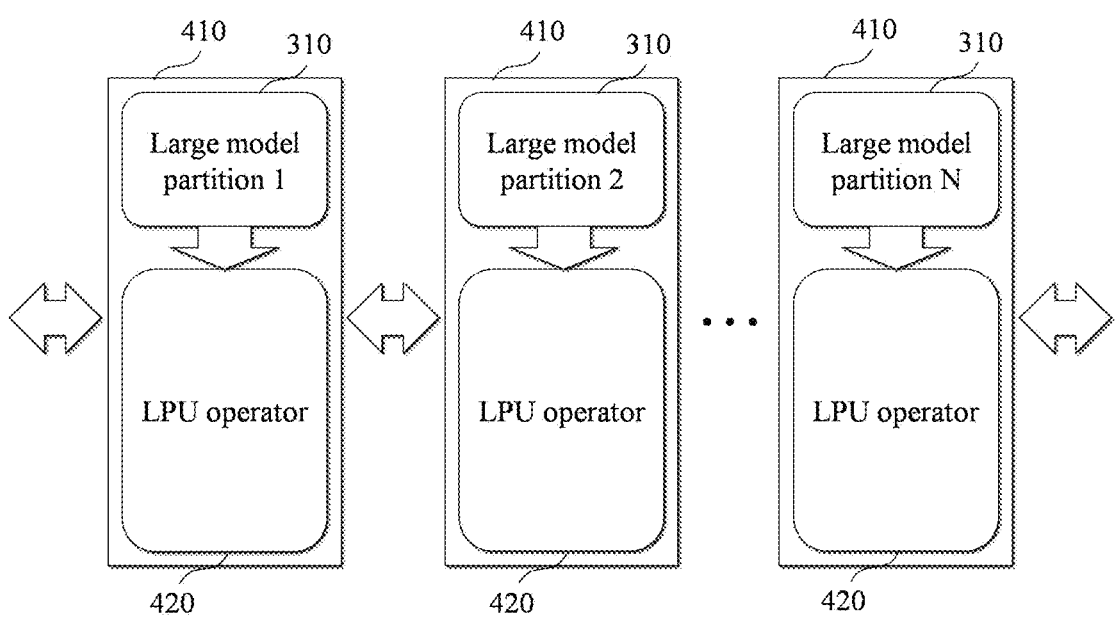

The example embodiment of FIG. 3 is an example of a processing-in-memory (PIM) model and shows an example in which a single LPU is implemented as a PIM chip and both a partition and an LPU operator are integrated into a single chip. The example embodiment of FIG. 3 illustrates a plurality of LPUs 410, a plurality of partitions 310, and a plurality of LPU operators 420, which may each be implemented with a single PIM chip. Here, each of the plurality of LPUs 410 may include a single partition 310 and a single LPU operator 420.

Figure 4:
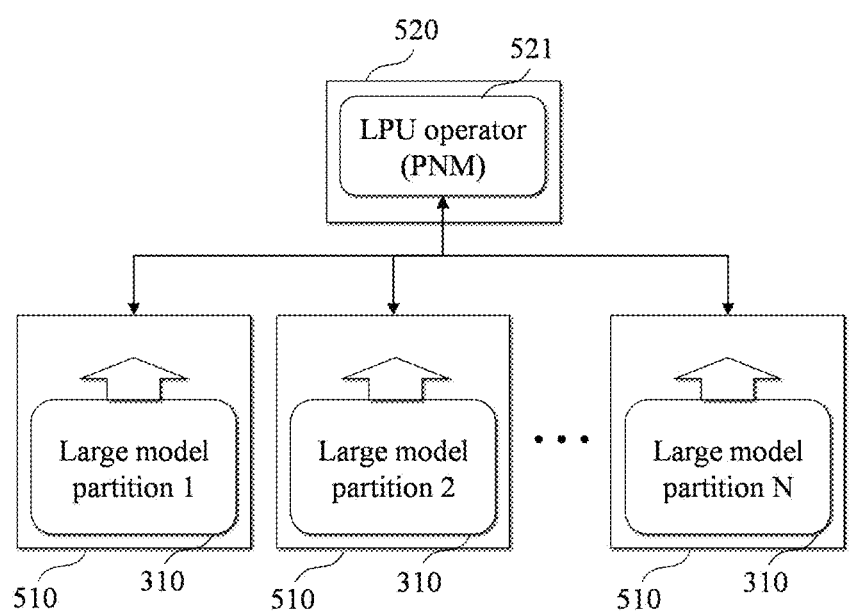

The example embodiment of FIG. 4 shows an example of a processing-near-memory (PNM) model. It may be difficult to include a configuration for processing all LPU operations in a single PIM chip. The example embodiment of FIG. 4 shows a model that stores the plurality of partitions 310 in a plurality of memory chips 510, respectively, and includes an LPU operator 521 for an LPU operation in a buffer chip 520, such as a PNM chip.

Figure 5:
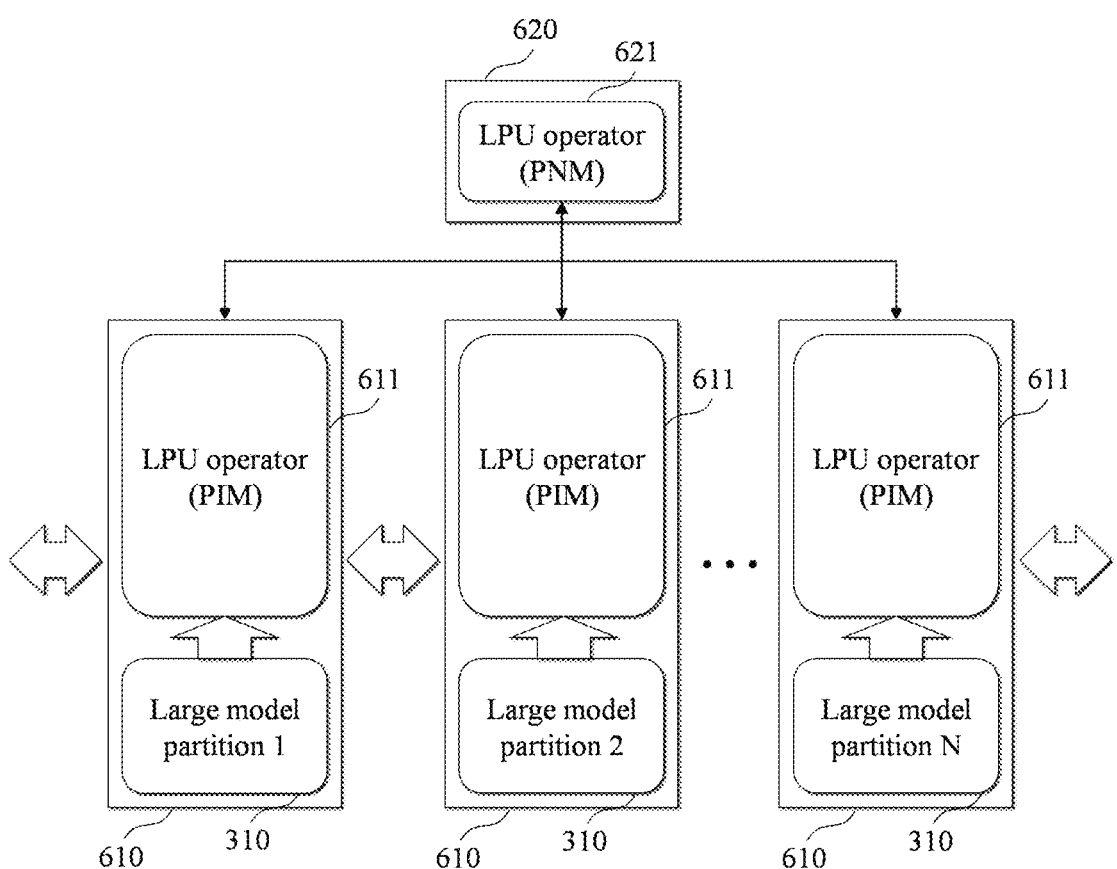

The example embodiment of FIG. 5 shows an example of a model in which PIM and PNM are combined. For example, the plurality of partitions 310 may be stored in a plurality of memory chips 610, respectively. Also, a PIM-type LPU operator 611 may be implemented in each of the plurality of memory chips 610, as an accumulator such as a MAC tree. Here, an LPU operator 621 for the remaining high-level operation of LPU may be implemented in a buffer chip 620 using a PNM method.

Figure 6:
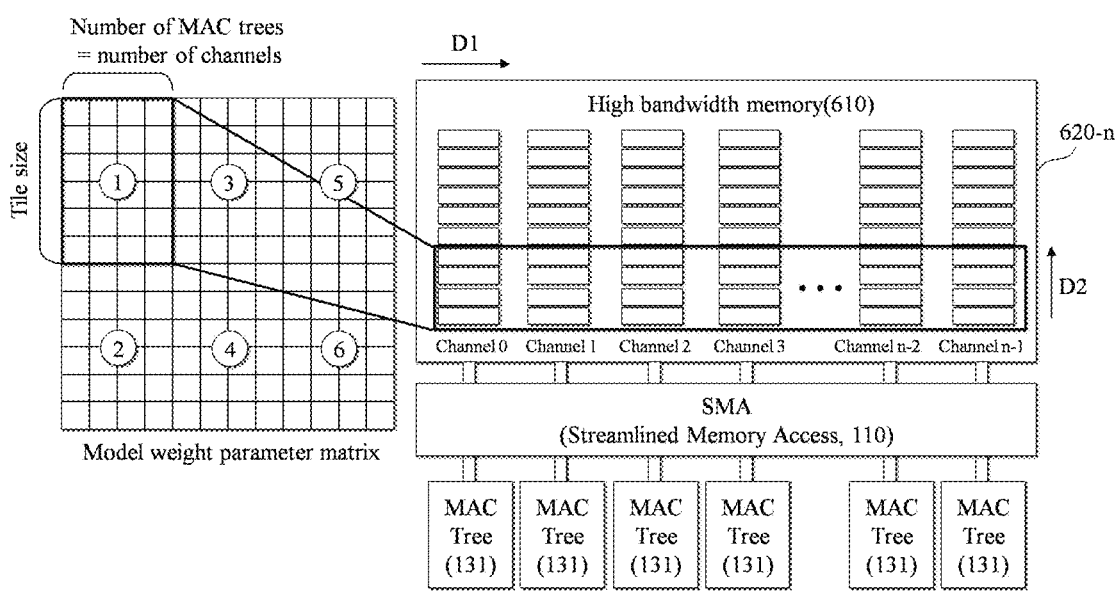
FIG. 6 illustrates an example of describing weight matrix data mapping of a high bandwidth memory for a matrix multiplication operation of a latency processing unit according to an example embodiment.

FIG. 6 illustrates an example of describing weight matrix data mapping of a high bandwidth memory for a matrix multiplication operation of a latency processing unit according to an example embodiment.

Referring to FIG. 6, the LPU 100 according to the example embodiment may store mapped weight matrix data in the high bandwidth memory 610, such as the HBM 200, to make it possible to load weight data without accessing other memory channels during a matrix multiplication operation of each MACT tree, based on the fact that the number of the plurality of MAC trees 131 and the number of memory channels of the SMA 110 are the same.

In detail, weight matrix data may be stored in the high bandwidth memory 610 to be mapped to each channel 620-*n* as many as the number of the plurality of MAC trees 131 in a column direction (D1) of the weight matrix. Since matrix multiplication operations may be performed in parallel in the column direction of the weight matrix, the plurality of MAC trees 131 may read column direction data from each assigned memory channel 620-*n* and may perform the matrix multiplication operation.

Then, the plurality of MAC trees 131 may map the weight matrix data such that a final operation result may be completed through accumulation in a row direction D2 of the weight matrix. The number of row data to be mapped at a time may be determined by a bandwidth of the high bandwidth memory 610, which may be determined by a tile size that the plurality of MAC trees 131 may process at a time.

Figure 7:
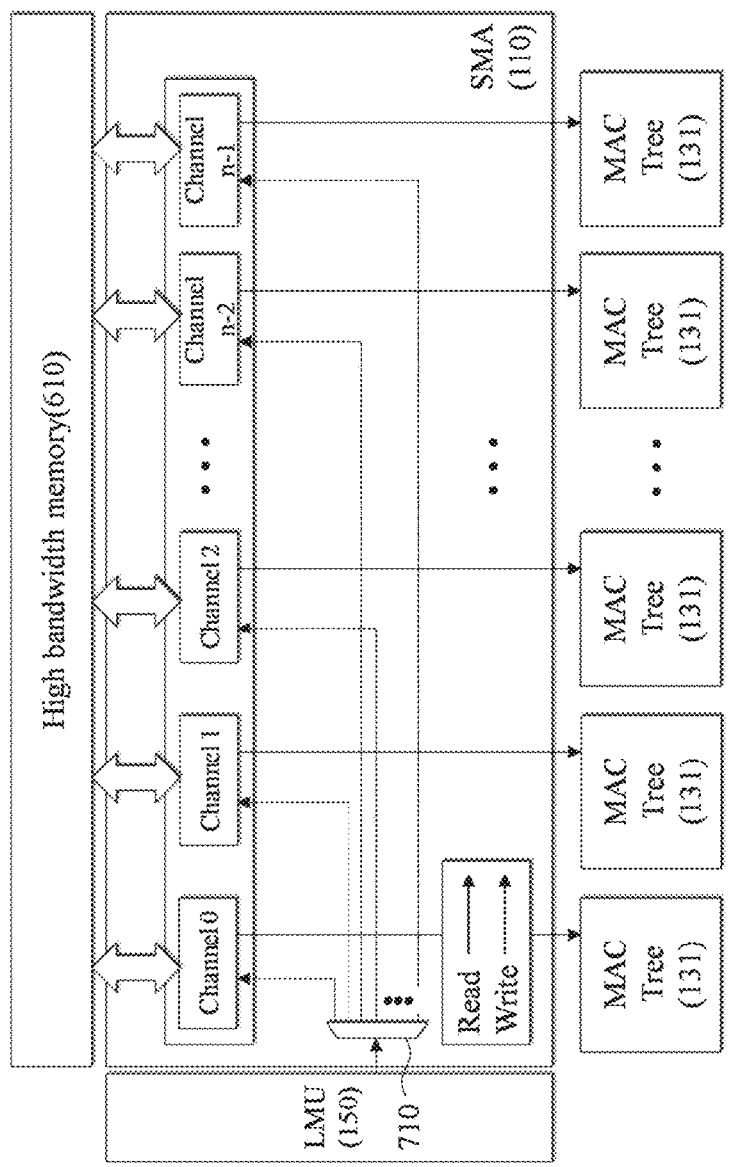
FIG. 7 illustrates an example of a high bandwidth memory interface included in a latency processing unit according to an example embodiment.

FIG. 7 illustrates an example of a high bandwidth memory interface included in a latency processing unit according to an example embodiment.

Referring to FIG. 7, the SMA 110 may connect the LMU 150, the plurality of MAC trees 131, and the high bandwidth memory 610. Since the SMA 110 is not connected to other operating devices of the LPU 100, a high bandwidth memory interface may be minimized in terms of hardware resources.

The plurality of MAC trees 131 and the memory channels 620-*n* may be connected to each other based on a one-to-one correspondence. That is, each of the plurality of MAC trees 131 does not need to access channels other than a directly assigned channel and accordingly, may perform a matrix multiplication operation without using a complex interface that uses many resources and has a high latency, for example, a cross-bar.

The SMA 110 may configure only a read interface that allows the plurality of MAC trees 131 to retrieve and read weight matrix data stored in the high bandwidth memory 610. That is, as described below, since an operation result is stored in the high bandwidth memory 610 through the LMU 150, a write interface for the high bandwidth memory 610 of the plurality of MAC trees 131 is not configured and corresponding hardware resources may be reduced accordingly.

In contrast, the SMA 110 may configure only a write interface between the LMU 150 and the high bandwidth memory 610. An operation result stored in the LMU 150 as an internal buffer through the SMA 110 may be transmitted to be recorded in the high bandwidth memory 610 and a memory channel for recording may be selected using a demultiplexer 710.

Figure 8:
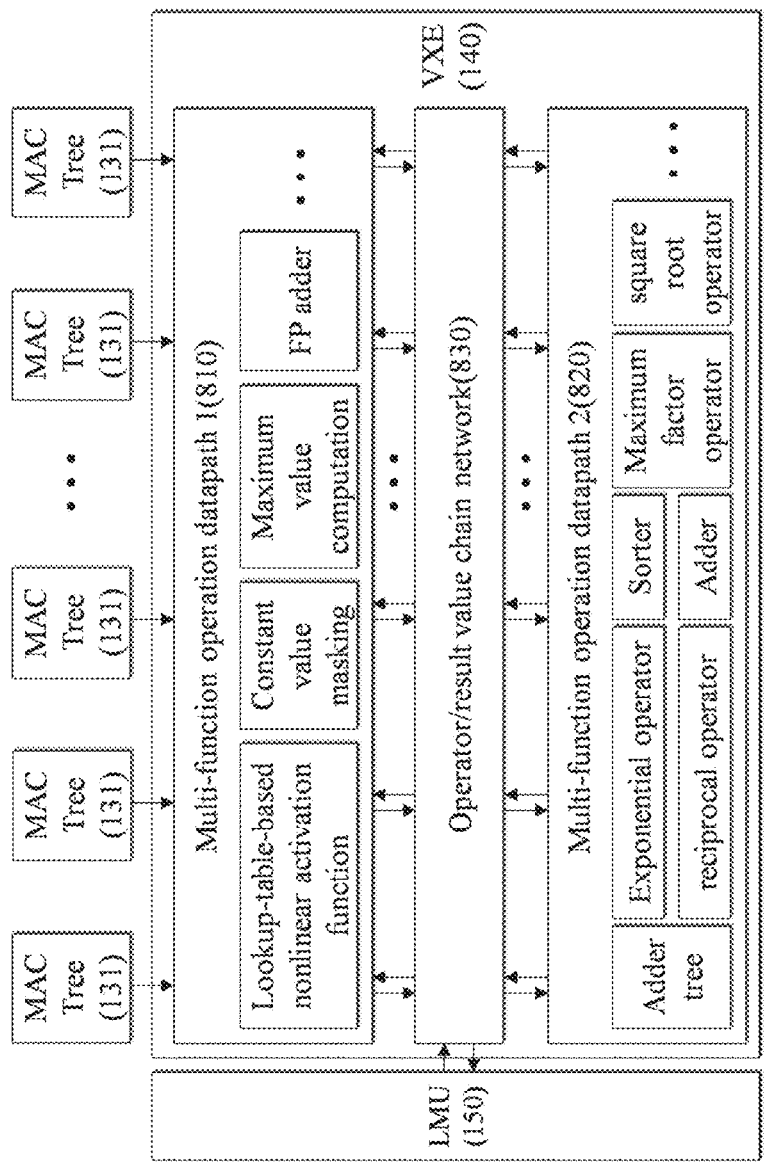
FIG. 8 illustrates an example of describing a reconfigurable multi-function operating device included in a latency processing unit according to an example embodiment.

FIG. 8 illustrates an example of describing a reconfigurable multi-function operating device included in a latency processing unit according to an example embodiment.

Referring to FIG. 8, the VXE 140 may include a plurality of multi-function operation datapaths 810 and 820, and the plurality of multi-function operation datapaths 810 and 820 may configure various operator combinations through connection to an operator/result value chain network 830.

As shown in FIG. 8, the plurality of multi-function operation datapaths 810 and 820 may include various operating devices required for, for example, a lookup-table-based nonlinear activation function, a masking operation and the like. However, the configuration of operating devices of the reconfigurable multi-function operation datapaths 810 and 820 is an example only and any additional operating device required for a large model operation may be included in the multi-function operation datapaths 810 and 820. An operation result by the VXE 140 may be delivered to the LMU 150.

Figure 9:
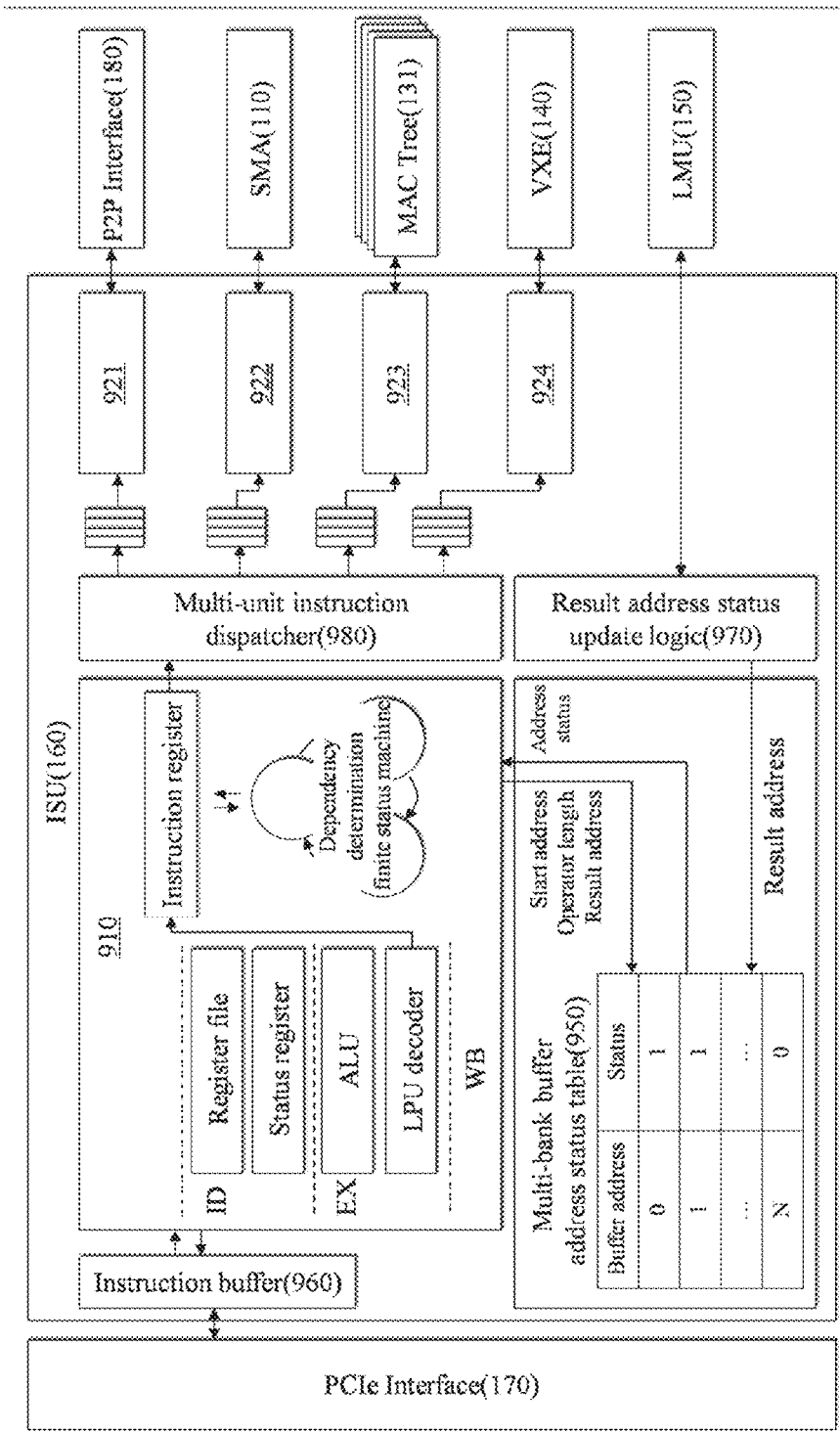
FIG. 9 illustrates an example of describing a configuration of an address-based out-of-order multi-unit scheduler included in a latency processing unit according to an example embodiment.

FIG. 9 illustrates an example of describing a configuration of an address-based out-of-order multi-unit scheduler included in a latency processing unit according to an example embodiment.

Referring to FIG. 9, the ISU 160 as the address-based out-of-order multi-unit scheduler included in the LPU 100 according to the example embodiment may include an address-based instruction dependency decision and scheduling controller 910, a plurality of instruction issue controllers 921, 922, 923, and 924, a multi-bank buffer address status table 950, an instruction buffer 960, a result address status update logic 970, and a multi-unit instruction dispatcher 980.

The ISU 160 may simultaneously operate operating devices and data transfer units through the address-based instruction dependency decision and scheduling controller 910 and the plurality of instruction issue controllers 921, 922, 923, and 924. Here, the ISU 160 may change a status for an operator address and a result address of the multi-bank buffer address status table 950 for an instruction performed in each operating device to 1.

The multi-bank buffer address status table 950 may change a status of a result address of a completed instruction through the result address status update logic 970 to 0.

The address-based instruction dependency decision and scheduling controller 910 may determine dependency between an instruction to be executed and an instruction being executed and dependency between instructions to be executed by referring to an address status through the multi-bank buffer address status table 970. Through this, since an instruction without dependency may be processed in advance, an idle time of each operating device and data transfer unit may be minimized.

The address-based instruction dependency decision and scheduling controller 910 included in the ISU 160 may load and process an instruction from the instruction buffer 960. Here, the address-based instruction dependency decision and scheduling controller 910 may execute a loop instruction and may decode other instructions and classify the instructions and then may deliver the same to the device-to-device (D2D) instruction issue controller 921, the direct memory access instruction issue controller 922, the MAC tree instruction issue controller 923, and the reconfigurable multi-function operating device instruction issue controller 924 through the multi-unit instruction dispatcher 980.

The ISU 160 may receive and store instructions of the LPU 100 from the host computer through the PCIe interface 170 and may store a current status of the LPU 100 in a register. The host computer may verify a corresponding status register through the PCIe interface 170.

The example embodiments provide a structure processible even in a large model at high speed using a graphics processing unit (GPU) device in a simulator that mimics a hardware structure. Also, to mimic a data type commonly used in machine learning down to an operator level, a compute unified device architecture (CUDA) kernel of a GPU is used to make it possible to verify precision of a final result value with a reduction in speed.

A simulator according to an example embodiment may be implemented to also utilize a GPU instead of using only a CPU. Since modules that perform most computation in the simulator are accelerated in the GPU, computation may be processed more quickly. However, in this case, it is difficult to extract a median value during processing of the simulator, which may be solved by supporting both a CPU mode and a GPU mode. In the small scope, detailed debugging may be enabled by processing all in the CPU. In the large scope, debugging may be quickly processed by actively using the GPU. Also, when additionally using the GPU, computation is performed using the CUDA kernel. Therefore, all CUDA supported operators may be used. Therefore, while changing a data type at an operator level, determination of high precision and low precision may be made even in a giant AI model.

Figure 10:
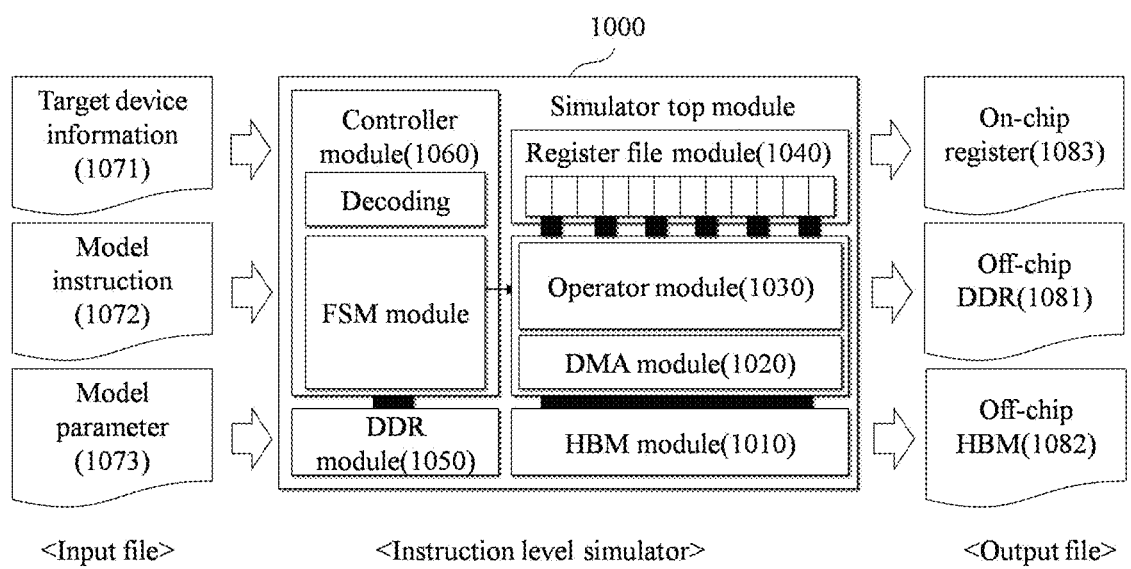
FIG. 10 illustrates an example of a structure of a simulator according to an example embodiment.

FIG. 10 illustrates an example of a structure of a simulator according to an example embodiment. As an example of the simulator, a simulator top module 1000 according to the example embodiment may include various modules configured to operate in the same manner as real hardware. The modules included in the simulator top module 100 may vary depending on hardware intended to support simulation. The example embodiment of FIG. 10 illustrates the simulator top module 100 implemented for simulation of the LPU 100 as hardware. In the example embodiment, the simulator top module 1000 may include an HBM module 1010, a DMA module 1020, an operator module 1030, a register file module 1040, a DDR module 1050, and a controller module 1060. Here, the HBM module 1010 may correspond to the HBM 200, the DMA module 1020 may correspond to the SMA 110, the operator module 1030 may correspond to the SXE 130, the register file module 1040 may correspond to the VXE 140, and the controller module 1060 may correspond to the ISU 160.

Most operations may be processed at the operator module 1030 and the DMA module 1020. The simulator top module 1000 may receive target device information 1071, a model instruction 1072, and a model parameter 1073 as input values. Here, the target device information 1071 may include, for example, information on a size of HBM and the number of HBMs. The simulator top module 1000 may dynamically construct internal modules based on the target device information 1071. The model instruction 1072 may be processed by the controller module 1060 and delivered to the operator module 1030, and the model parameter 1073 may be stored in the HBM module 1010 and then, delivered to the operator module 1030 through the DMA module 1020. For example, the operator module 1030 may process a matrix multiplication operation between input delivered through the controller module 1060 and a weight matrix read from the HBM module 1010 through the DMA module 1020.

As such, the simulator top module 100 may compute an instruction in the same manner as real hardware and may store a final result in an off-chip double data rate (DDR) 1081 and an off-chip HBM 1082. Also, the simulator top module 100 may dump the stored final result in HEX format to be verifiable. Here, the HEX format may represent a file format that delivers binary information in ASCII text format. Also, the simulator top module 100 may store a median value of the operation delivered to the register file module 1040 in an on-chip register 1083 such that the median value may be verified.

Figure 11:
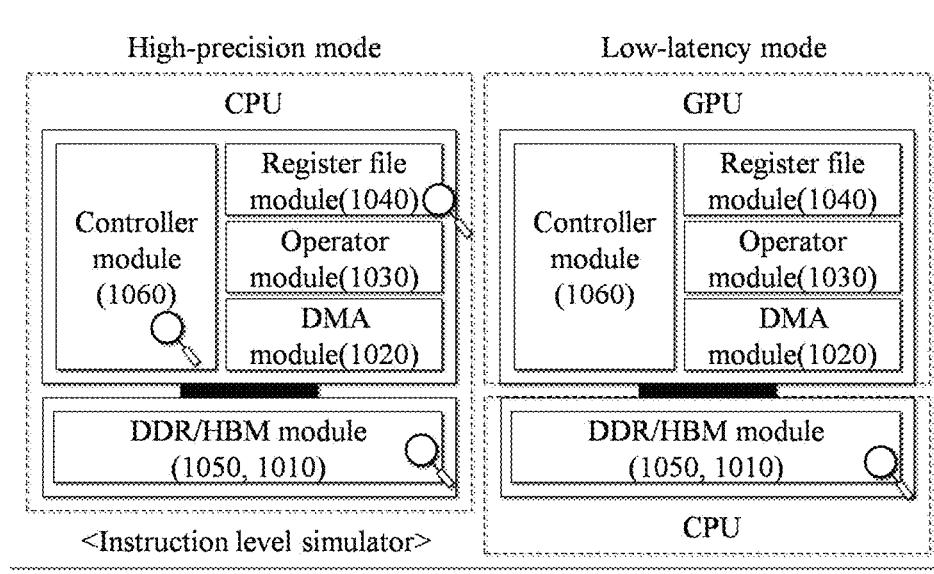
FIG. 11 illustrates an example of describing a high-precision mode and a low-latency mode according to an example embodiment.

FIG. 11 illustrates an example of describing a high-precision mode and a low-latency mode according to an example embodiment. In the high-precision mode, all operations of a simulator may be processed by a CPU. Since the simulator operates like a normal simulator, a median value may be verified at any time if the median value desires to be verified. In the low-latency mode, all modules (e.g., DMA module 1020, operator module 1030, register file module 1040, and controller module 1060) each in which an operation occurs may be assigned to a GPU. Since all modules each in which an operation occurs are assigned to the GPU, verifying a median value may reduce speed, making it impossible to verify the median value. However, since the DDR module 1050 and the HBM module 1010 in which a final value is stored are present at a CPU level, the final value may be verified.

The high-precision mode is useful when a computational amount is small, such as when the number of layers or the number of tokens is small, and the low-latency mode is useful when a computational amount is large, such as when a layer length or a token length is long. Therefore, for example, debugging may be performed in the order of catching bugs in the high-precision mode and then finding edge cases in the low-latency mode.

Figure 12:
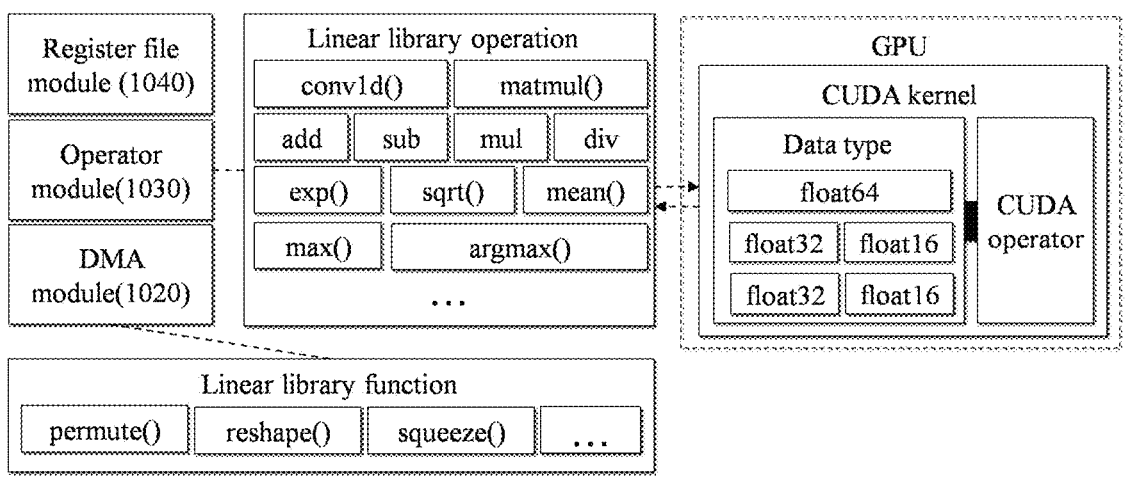
FIG. 12 illustrates an example of assigning a module to a graphics processing unit (GPU) according to an example embodiment.

FIG. 12 illustrates an example of assigning a module to a GPU according to an example embodiment.

The order of values may be changed in a weight matrix of an AI model. For example, a rotary embedding operation of a transformer model requires an operation between values at distant positions after performing a matrix multiplication operation. Since this makes hardware routing congested, values to be used for the operation may be moved to adjacent positions by changing the order of values of the weight matrix in a memory mapping process.

In this case, the DMA module 1020 may serve to inversely compute model mapping and to return the same to the original weight matrix. In the case of using a GPU, model mapping may be returned using a GPU-friendly linear library function, without using a programing language statement such as "for loop," which is familiar to a CPU. Therefore, inverse computation for model mapping may be efficiently processed on both the CPU and the GPU. Since model mapping is returned to the original matrix in the DMA module 1020, operations of linear library, such as matrix multiplication (matmul), may be used as is in the operator module 1030. These are also operations familiar to both the CPU and the GPU.

Additionally, when processing a linear library operation on the GPU, an operation may be performed computed through a CUDA kernel. In this case, an operator included in the GPU may be used. This represents that data precision may be closely mimicked by real RTL. For example, when processing floating point 16 bits (float16) on the CPU, float 16 is changed to float 32 and a float32 operator may be used since a float16 operator is absent in the CPU. This enables more precise operations than real RTL simulation, while disallowing RTL simulation to be accurately mimicked. On the other hand, the GPU includes various data types of operators frequently used for an AI inference process and thus, may more accurately mimic RTL simulation.

Figure 13:
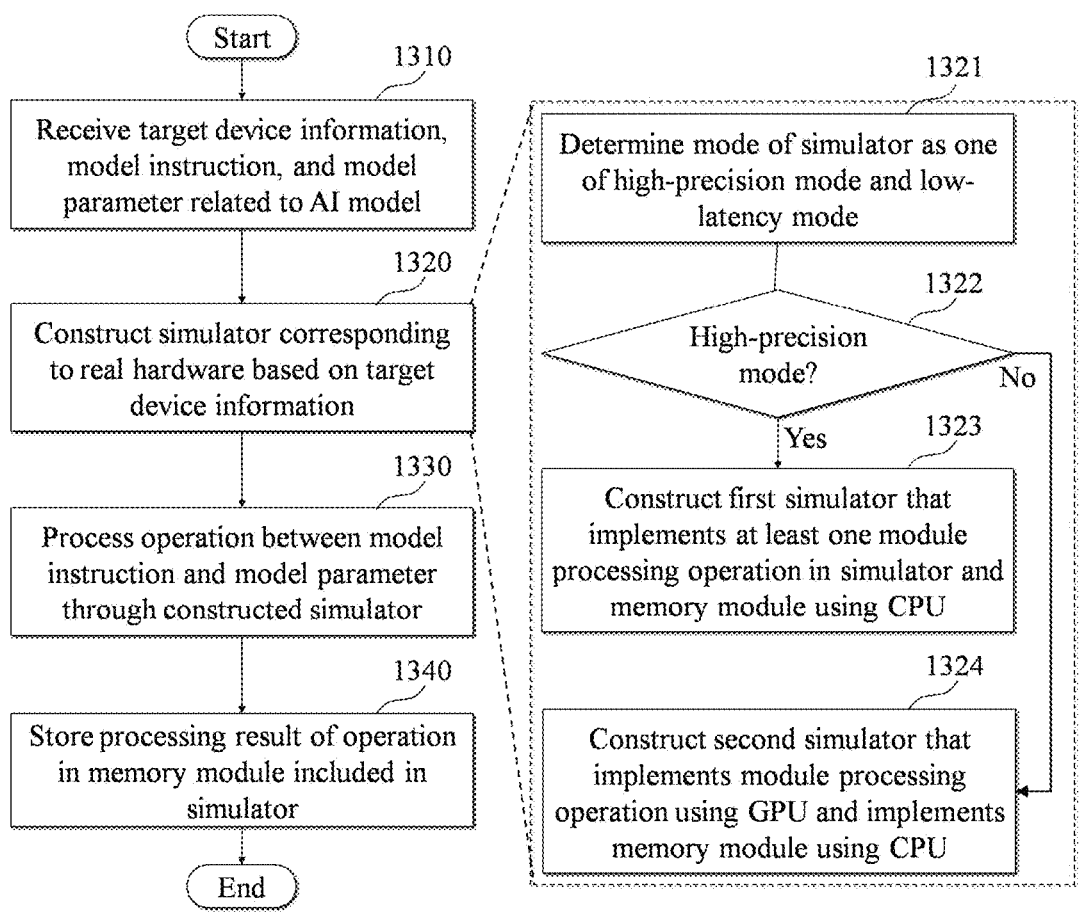
FIG. 13 is a flowchart illustrating an example of a verification method according to an example embodiment.

FIG. 13 is a flowchart illustrating an example of a verification method according to an example embodiment. The verification method according to an example embodiment may be performed by at least one computer device. Here, at least one processor of the computer device may be implemented to execute a control instruction according to a code of at least one computer program or a code of an OS included in a memory. Here, the at least one processor may control the computer device to perform operations 1310 to 1340 included in the verification method of FIG. 13 in response to a control instruction included in a code stored in the computer device. An example of the structure of the computer device is further described with reference to FIG. 14.

In operation 1310, the computer device may receive target device information, a model instruction, and a model parameter related to an AI model. Here, the target device information, the model instruction, and the model parameter may correspond to the target device information 1071, the model instruction 1072, and the model parameter 1073 described with FIG. 10, respectively.

In operation 1320, the computer device may construct a simulator corresponding to real hardware based on the target device information. Here, at least one processor included in the computer device may include a CPU and a GPU. In this case, in operation 1320, the computer device may construct a first simulator that uses the CPU in response to a high-precision mode being selected and may construct a second simulator that uses both the CPU and the GPU in response to a low-latency mode being selected. In detail, operation 1320 may include operations 1321 to 1324.

In operation 1321, the computer device may determine a mode of the simulator as one of the high-precision mode and the low-latency mode. For example, the computer device may determine the mode of the simulator as one of the high-precision mode and the low-latency mode based on at least one of a layer length included in the AI model, the number of layers, a token length for the AI model, and the number of tokens.

In operation 1322, the computer device may determine whether the mode of the simulator is determined as the high-precision mode. When the mode of the simulator is determined as the high-precision mode, the computer device may perform 1323. When the mode of the simulator is not determined as the high-precision mode, that is, is determined as the low-latency mode, the computer device may perform operation 1324.

In operation 1323, the computer device may construct a first simulator that implements at least one module processing an operation in the simulator and a memory module using the CPU. For example, the computer device may construct the first simulator by assigning the module processing the operation and the memory module to the CPU.

In operation 1324, the computer device may construct a second simulator that implements the module processing the operation using the GPU and implements the memory module using the CPU. For example, the computer device may construct the second simulator by assigning the module processing the operation to the GPU and by assigning the memory module to the CPU. Here, the second simulator may inversely compute the weight matrix with an adjusted position of a value and may return the same to the original weight matrix, when mapping the weight matrix of the AI model.

In operation 1330, the computer device may process the operation between the model instruction and the model parameter through the constructed simulator. For example, the first simulator may process each operation through the CPU and the second simulator may process each operation through a CUDA kernel of the GPU.

In operation 1340, the computer device may store a processing result of the operation in the memory module included in the simulator. Here, in the high-precision mode, a median value of the operation may be verifiable in each module of the first simulator. Also, in the low-latency mode, a final value of the operation may be verifiable in the memory module of the second simulator.

As such, according to example embodiments, it is possible to provide a method and system for verifying an operation and data precision of generative giant artificial intelligence hardware.

Figure 14:
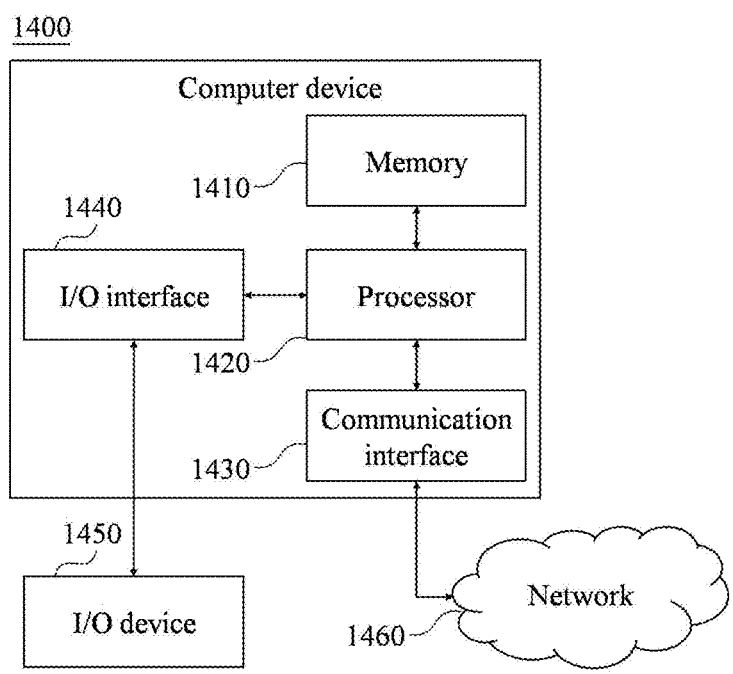
FIG. 14 is a block diagram illustrating an example of a computer device according to an example embodiment.

FIG. 14 is a block diagram illustrating an example of a computer device according to an example embodiment. Referring to FIG. 14, a computer device 1400 may include a memory 1410, a processor 1420, a communication interface 1430, and an input/output (I/O) interface 1440. The memory 1410 may include a permanent mass storage device, such as a random access memory (RAM), a read only memory (ROM), and a disk drive, as a non-transitory computer-readable record medium. Here, the permanent mass storage device, such as ROM and a disk drive, may be included in the computer device 1400 as a permanent storage device separate from the memory 1410. Also, an OS and at least one program code may be stored in the memory 1410. Such software components may be loaded to the memory 1410 from another non-transitory computer-readable record medium separate from the memory 1410. The other non-transitory computer-readable record medium may include a non-transitory computer-readable record medium, for example, a floppy drive, a disk, a tape, a DVD/CD-ROM drive, a memory card, etc. According to other example embodiments, software components may be loaded to the memory 1410 through the communication interface 1430, instead of the non-transitory computer-readable record medium. For example, the software components may be loaded to the memory 1410 of the computer device 1400 based on a computer program installed by files received over a network 1460.

The processor 1420 may be configured to process instructions of a computer program by performing basic arithmetic operations, logic operations, and I/O operations. The computer-readable instructions may be provided by the memory 1410 or the communication interface 1430 to the processor 1420. For example, the processor 1420 may be configured to execute received instructions in response to a program code stored in a storage device, such as the memory 1410.

The communication interface 1430 may provide a function for communication between the computer device 1400 and another apparatus over the network 1460. For example, the processor 1420 of the computer device 1400 may forward a request or an instruction created based on a program code stored in the storage device such as the memory 1410, data, and a file, to other apparatuses over the network 1460 under control of the communication interface 1430. Inversely, a signal, an instruction, data, a file, etc., from another apparatus may be received at the computer device 1400 through the communication interface 1430 of the computer device 1400 over the network 1460. A signal, an instruction, data, etc., received through the communication interface 1430 may be forwarded to the processor 1420 or the memory 1410, and a file, etc., may be stored in a storage medium, for example, the permanent storage device, further includable in the computer device 1400.

The I/O interface 1440 may be a device used for interfacing with an I/O device 1450. For example, an input device may include a device, such as a microphone, a keyboard, a mouse, etc., and an output device may include a device, such as a display, a speaker, etc. As another example, the I/O interface 1440 may be a device for interfacing with an apparatus in which an input function and an output function are integrated into a single function, such as a touchscreen. The I/O device 1450 may be configured as a single apparatus with the computer device 1400.

Also, according to other example embodiments, the computer device 1400 may include a greater or smaller number of components than the number of components of FIG. 14. However, there is no need to clearly illustrate most conventional components. For example, the computer device 1400 may be configured to include at least a portion of the I/O device 1450 or may further include other components, such as a transceiver and a database.

Although the example embodiments are described above with reference to the accompanying drawings, it will be understood by one of ordinary skill in the art that the present invention can be implemented in other specific forms without changing technical spirit or essential features of the invention. Therefore, the example embodiments should be understood in all respects as illustrative and not construed as limiting.

What is claimed is:

1. A verification method of a computer device comprising at least one processor, the verification method comprising:
   receiving, by the at least one processor, target device information, a model instruction, and a model parameter related to an artificial intelligence (AI) model;
   constructing, by the at least one processor, a simulator corresponding to real hardware based on the target device information;
   processing, by the at least one processor, an operation between the model instruction and the model parameter through the constructed simulator; and
   storing, by the at least one processor, a processing result of the operation in a memory module included in the simulator,
   wherein the at least one processor includes a central processing unit (CPU) and a graphics processing unit (GPU), and
   the constructing of the simulator comprises:
   determining a mode of the simulator as one of a high-precision mode and a low-latency mode;
   in response to the mode of the simulator being determined as the high-precision mode, constructing a first simulator in which at least one module processing the operation in the simulator and the memory module are assigned to the CPU; and
   in response to the mode of the simulator being determined as the low-latency mode, constructing a second simulator in which at least one module processing the operation is assigned to the GPU and the memory module is assigned to the CPU.

2. The verification method of claim 1, wherein the determining comprises determining the mode of the simulator as one of the high-precision mode and the low-latency mode based on at least one of a layer length included in the AI model, the number of layers, a token length for the AI model, and the number of tokens.

3. The verification method of claim 1, wherein:
   in the high-precision mode, a median value of the operation is verifiable in each module of the first simulator, and
   in the low-latency mode, a final value of the operation is verifiable in the memory module of the second simulator.

4. The verification method of claim 1, wherein:
   a position of a value of a weight matrix of the AI model is adjusted in a memory mapping process for processing of the operation, and
   the second simulator is configured to inversely compute the weight matrix with the adjusted position of the value using a linear library function based on the GPU and to return the same to an original weight matrix.

5. The verification method of claim 1, wherein the second simulator is configured to process the operation through a compute unified device architecture (CUDA) kernel of the GPU.

6. A non-transitory computer-readable recording medium storing a program to execute the method of claim 1 on the computer device.

7. A computer device comprising:
   at least one processor configured to execute computer-readable instructions,
   wherein the at least one processor is configured to,
   receive target device information, a model instruction, and a model parameter related to an artificial intelligence (AI) model,
   construct a simulator corresponding to real hardware based on the target device information,
   process an operation between the model instruction and the model parameter through the constructed simulator, and
   store a processing result of the operation in a memory module included in the simulator, and
   the at least one processor includes a central processing unit (CPU) and a graphics processing unit (GPU), and
   to construct the simulator, the at least one processor is configured to,
   construct a first simulator that uses the CPU in response to a high-precision mode being selected and construct a second simulator that uses both the CPU and the GPU in response to a low-latency mode being selected, and
   to construct the simulator, the at least one processor is configured to,
   determine a mode of the simulator as one of the high-precision mode and the low-latency mode,
   in response to the mode of the simulator being determined as the high-precision mode, construct the first simulator in which at least one module processing the operation in the simulator and the memory module are assigned to the CPU, and in response to the mode of the simulator being determined as the low-latency mode, construct a second simulator in which at least one module processing the operation is assigned to the GPU and the memory module is assigned to the CPU.

8. The computer device of claim 7, wherein, to determine the mode of the simulator, the at least one processor is configured to determine the mode of the simulator as one of the high-precision mode and the low-latency mode based on at least one of a layer length included in the AI model, the number of layers, a token length for the AI model, and the number of tokens.

9. The computer device of claim 7, wherein:

in the high-precision mode, a median value of the operation is verifiable in each module of the first simulator, and in the low-latency mode, a final value of the operation is verifiable in the memory module of the second simulator.

10. The computer device of claim 7, wherein:

a position of a value of a weight matrix of the AI model is adjusted in a memory mapping process for processing of the operation, and the second simulator is configured to inversely compute the weight matrix with the adjusted position of the value using a linear library function based on the GPU and to return the same to an original weight matrix.

* * * * *